United States Patent
Chang

(10) Patent No.: US 11,682,230 B2
(45) Date of Patent: Jun. 20, 2023

(54) FINGERPRINT SIGNAL PROCESSING CIRCUIT AND METHOD FOR SIGNAL COMPENSATION IN ANALOG FRONT-END

(71) Applicant: NOVATEK Microelectronics Corp., Hsin-Chu (TW)

(72) Inventor: Tsen-Wei Chang, Taichung (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/809,575

(22) Filed: Mar. 5, 2020

(65) Prior Publication Data

US 2020/0285829 A1    Sep. 10, 2020

Related U.S. Application Data

(60) Provisional application No. 62/814,867, filed on Mar. 7, 2019.

(51) Int. Cl.
*G06V 40/12*    (2022.01)
*G06V 40/13*    (2022.01)
*H10K 59/65*    (2023.01)

(52) U.S. Cl.
CPC ...... *G06V 40/1347* (2022.01); *G06V 40/1318* (2022.01); *H10K 59/65* (2023.02)

(58) Field of Classification Search
CPC ............. G06K 9/00067; G06K 9/0004; G06K 9/00046; H01L 27/3234
See application file for complete search history.

(56) References Cited

U.S. PATENT DOCUMENTS

| | | | | |
|---|---|---|---|---|
| 3,959,884 A * | 6/1976 | Jordan | ............... | G06K 9/00067 283/69 |
| 4,015,240 A * | 3/1977 | Swonger | ............ | G06K 9/00067 382/125 |
| 4,246,568 A * | 1/1981 | Peterson | .................. | G06K 9/66 382/126 |
| 7,359,553 B1 * | 4/2008 | Wendt | .................. | G06K 9/0008 358/2.99 |
| 10,901,513 B2 * | 1/2021 | Moussette | ............... | G06F 3/016 |

(Continued)

FOREIGN PATENT DOCUMENTS

| CA | 2 428 996 A1 | 6/2002 |
|---|---|---|
| CN | 105574520 A | 5/2016 |

(Continued)

*Primary Examiner* — David D Davis
(74) *Attorney, Agent, or Firm* — Winston Hsu

(57) ABSTRACT

A fingerprint signal processing circuit for a fingerprint sensor configured to sense light from a display panel touchable by a finger includes an analog front-end (AFE) circuit and an analog-to-digital converter (ADC). The AFE circuit is configured to receive an image signal from at least one sensing pixel of the fingerprint sensor and generate an analog output signal. The AFE circuit includes a gain circuit, which is configured to receive a compensation signal and process the image signal according to the compensation signal to generate the analog output signal, wherein a signal value of the compensation signal corresponds to a touched position of the finger in the fingerprint sensor. The ADC, coupled to the AFE circuit, is configured to convert the analog output signal into a digital code.

31 Claims, 10 Drawing Sheets

(56) References Cited

U.S. PATENT DOCUMENTS

| | | | |
|---|---|---|---|
| 2004/0013287 A1* | 1/2004 | Takeuchi | G06K 9/00006 382/124 |
| 2008/0123908 A1* | 5/2008 | Waldman | G06K 9/00046 382/124 |
| 2016/0187961 A1 | 6/2016 | Elibol | |
| 2016/0291718 A1* | 10/2016 | Cho | G06K 9/0002 |
| 2016/0291766 A1* | 10/2016 | Shen | G06F 3/04182 |
| 2017/0177920 A1 | 6/2017 | Kremin | |
| 2018/0039809 A1 | 2/2018 | Chung | |
| 2018/0114047 A1* | 4/2018 | Kim | G06K 9/00026 |
| 2018/0314379 A1* | 11/2018 | Shen | G06F 3/0446 |
| 2018/0314874 A1* | 11/2018 | Yang | G06F 3/0484 |
| 2018/0365465 A1* | 12/2018 | Kim | G06F 3/044 |
| 2018/0365467 A1* | 12/2018 | Robison | G06K 9/00087 |
| 2020/0111825 A1* | 4/2020 | Yin | G06K 9/0004 |

FOREIGN PATENT DOCUMENTS

| | | |
|---|---|---|
| CN | 107004130 A | 8/2017 |
| CN | 107580709 A | 1/2018 |
| CN | 108614646 A | 10/2018 |
| CN | 109308144 A | 2/2019 |
| TW | 201534860 A | 9/2015 |
| TW | M570473 U | 11/2018 |
| WO | 2017/143863 A1 | 8/2017 |

* cited by examiner

FINGERPRINT SIGNAL PROCESSING CIRCUIT AND METHOD FOR SIGNAL COMPENSATION IN ANALOG FRONT-END

CROSS REFERENCE TO RELATED APPLICATIONS

This application claims the benefit of U.S. Provisional Application No. 62/814,867, filed on Mar. 7, 2019, the contents of which are incorporated herein by reference.

BACKGROUND OF THE INVENTION

1. Field of the Invention

The present invention relates to a signal processing circuit and method, and more particularly, to a signal processing circuit and method for fingerprint signals.

2. Description of the Prior Art

Fingerprint recognition technology is widely applied in a variety of electronic products such as a mobile phone, laptop, tablet, personal digital assistant (PDA), and portable electronics, for realizing identity recognition. The fingerprint sensing allows a user to perform identity recognition conveniently, where the user only needs to put his/her finger on a fingerprint sensing pad or area to login the electronic device instead of entering long and tedious username and password.

Please refer to FIG. 1, which illustrates an organic light-emitting diode (OLED) panel, below which a complementary metal-oxide semiconductor (CMOS) image sensor for a lens-type fingerprint sensor (CIS-FPR) may be disposed. The image sensor may include multiple sensing pixels arranged as an array, to be spread over the sensing area for receiving the fingerprint image. A lens may be disposed between the OLED panel and the sensor for collecting light. The lens may be implemented by any method, such as being glued to the bottom of the OLED panel. The operation principle of the fingerprint sensor is that, the OLED panel emits light upwards, and the light is reflected by a touch finger, passes through the lens, and then be received by the sensor.

Due to the implementations of the lens and the structure of the OLED panel, the light intensity received by different sensing pixels of the sensor may be interfered with by a noise having different signal values. The noise is associated with the lens shape and the panel structure, and thus called the fixed pattern noise (FPN). In general, the FPN may have a signal value far greater than the ridge-to-valley difference of a fingerprint image, and thus cause the difficulty on amplification of the effective signals. Thus, there is a need for improvement over the prior art.

SUMMARY OF THE INVENTION

It is therefore an objective of the present invention to provide a fingerprint signal processing circuit and method, which may be capable of reducing or removing the fixed pattern noise (FPN) in the received fingerprint image signal.

An embodiment of the present invention discloses a fingerprint signal processing circuit for a fingerprint sensor configured to sense light from a display panel touchable by a finger. The fingerprint signal processing circuit comprises an analog front-end (AFE) circuit and an analog-to-digital converter (ADC). The AFE circuit is configured to receive an image signal from at least one sensing pixel of the fingerprint sensor and generate an analog output signal. The AFE circuit comprises a gain circuit, which is configured to receive a compensation signal and process the image signal according to the compensation signal to generate the analog output signal, wherein a signal value of the compensation signal corresponds to a touched position of the finger in the fingerprint sensor. The ADC, coupled to the AFE circuit, is configured to convert the analog output signal into a digital code.

Another embodiment of the present invention discloses a method of processing fingerprint signals for a fingerprint signal processing circuit. The fingerprint signal processing circuit is coupled to a fingerprint sensor configured to sense light from a display panel touchable by a finger. The method comprises the steps of: receiving an image signal from at least one sensing pixel of the fingerprint sensor; receiving a compensation signal, and processing the image signal according to the compensation signal to generate an analog output signal, wherein a signal value of the compensation signal corresponds to a touched position of the finger in the fingerprint sensor; and converting the analog output signal into a digital code.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
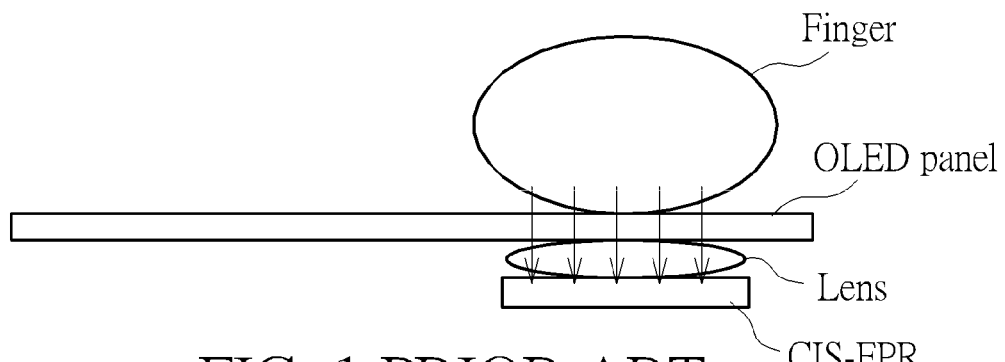
FIG. 1 illustrates an exemplary OLED panel.
Figure 2:
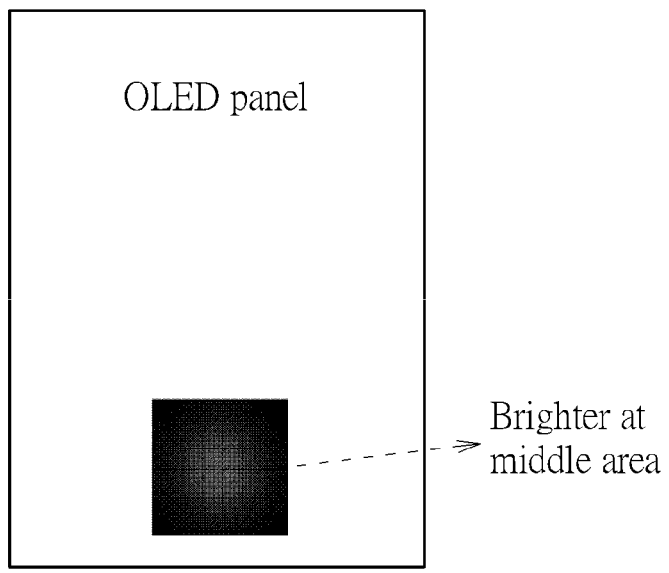
FIG. 2 illustrates an exemplary brightness distribution of a fingerprint image under the lens.

Please continue to refer to FIG. 1, which illustrates an exemplary organic light-emitting diode (OLED) panel. Based on the lens-type structure, at least one lens may be disposed above the fingerprint sensor or included in the fingerprint sensor. The lens may have an optical feature that the light transmission ratio may be different at different locations of the lens. In detail, the lens may be a collective lens, such that the light sensed by at least one sensing pixel at the middle area of the lens may usually be brighter, and the light sensed by at least one sensing pixel at the peripheral area of the lens may usually be darker. Therefore, the actually generated fingerprint image may have a brightness distribution as exemplarily illustrated in FIG. 2.

Figure 3:
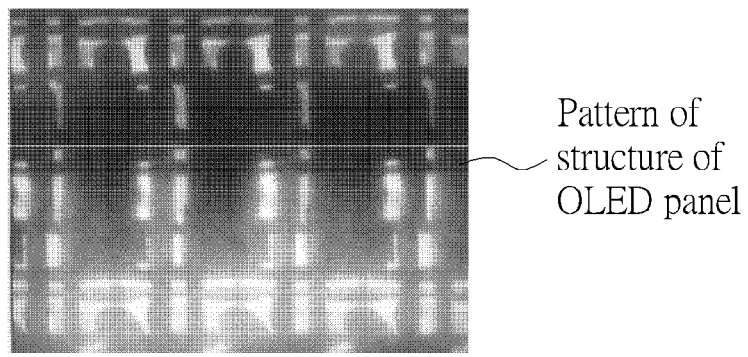
FIG. 3 is an exemplary schematic diagram of a pattern causing different light transmission ratios at different locations of the OLED panel.

In addition, since the fingerprint sensor is disposed below the OLED panel and the fingerprint image comes from the upper side of the OLED panel, the light reflected by the finger may be partially blocked by the structure of the OLED panel, which may have a pattern causing different light transmission ratios at different locations of the OLED panel, as exemplarily shown in FIG. 3. Nevertheless, the light intensity actually received by the fingerprint sensor is still broadly consistent with the feature of higher brightness in the middle and lower brightness in the peripheral with respect to the position of the lens.

According to the abovementioned feature of the lens, supposing that there are two sensing pixels in the fingerprint sensor where a sensing pixel is located in the brighter middle area and another sensing pixel is located in the darker peripheral area, the basic brightness sensed by these two sensing pixels may be different due to the non-uniformity of light transmission ratios at different locations caused by the lens and/or the panel's pattern. Therefore, the fingerprint image signals transmitted to follow-up circuits may be different between the sensing pixels at different locations, i.e., may have different magnitudes of fixed pattern offset. This fixed pattern offset is a fixed offset under the implementation of lens and the structure of OLED panel, to be considered as a fixed pattern noise (FPN) in the fingerprint image signals. The sensing pixel located in the middle area of lens may receive brighter signals and thus have higher basic signals, and the sensing pixel located in the peripheral area of lens may receive darker signals and thus have lower basic signals.

Figure 4:
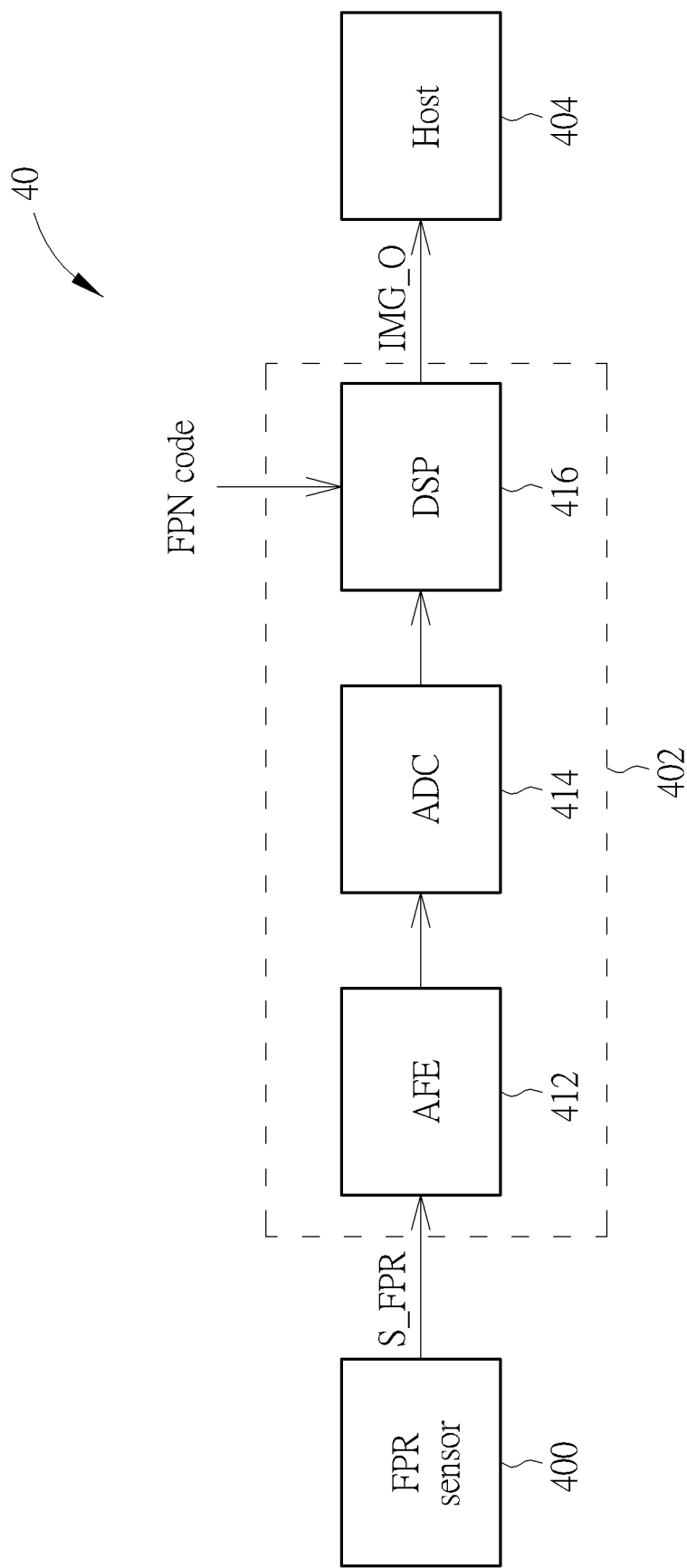
FIG. 4 is a schematic diagram of a fingerprint sensing system according to an embodiment of the present invention.

Please refer to FIG. 4, which is a schematic diagram of a fingerprint sensing system 40 according to an embodiment of the present invention. As shown in FIG. 4, the fingerprint sensing system 40 can include a fingerprint (FPR) sensor 400, a fingerprint signal processing circuit 402 and a host device 404. The fingerprint sensor 400, which may be an optical fingerprint sensor, can be configured to receive light reflected from a touch finger and generate a fingerprint image signal S_FPR. In an embodiment, the fingerprint sensor 400 may be a lens-type fingerprint sensor as shown in FIG. 1, where the received light is collected through a lens.

The fingerprint signal processing circuit 402 may be an integrated circuit (IC) implemented in a chip. In detail, the fingerprint signal processing circuit 402 may include an analog front-end (AFE) circuit 412, an analog-to-digital converter (ADC) 414 and a digital signal processing (DSP) circuit 416. After the fingerprint image signal S_FPR generated by (or according to a sensing result of) the fingerprint sensor 400 is outputted, the signal may enter the AFE circuit 412 and then be processed by the ADC 414 to generate a corresponding digital data code.

In general, in order to compensate the image signal, for the purpose such as removing the FPN, a code which may correspond to the FPN (here referred to as "FPN code"), may be applied to the DSP circuit 416 which can subtract the FPN code from the data code generated by the ADC 414. For example, a summation/subtraction circuit or procedure may be implemented to subtract a code corresponding to the FPN from the data code generated by the ADC 414. After processing (comprising deduction of the FPN) the data code generated by the ADC 414, the DSP circuit 416 may generate output image data IMG_O, which can be further forwarded to the host device 404 for fingerprint recognition. The output image data IMG_O can be generated, for example, after the FPN is removed, and thus may be able to reflect the ridge-to-valley difference of fingerprint.

However, although the fingerprint image signal S_FPR may be compensated (for example, to eliminate the FPN of the fingerprint image signal S_FPR) in the DSP circuit 416, the analog fingerprint image signal S_FPR may still need to be compensated. This may further enhance the performance of the ADC 414. For example, the FPN may still exist in the analog fingerprint image signal S_FPR and thus reduce the performance of the ADC 414. Therefore, it is preferable to compensate the image signal (for example, to reduce or remove the FPN) in or prior to the AFE circuit 412.

Figure 5:
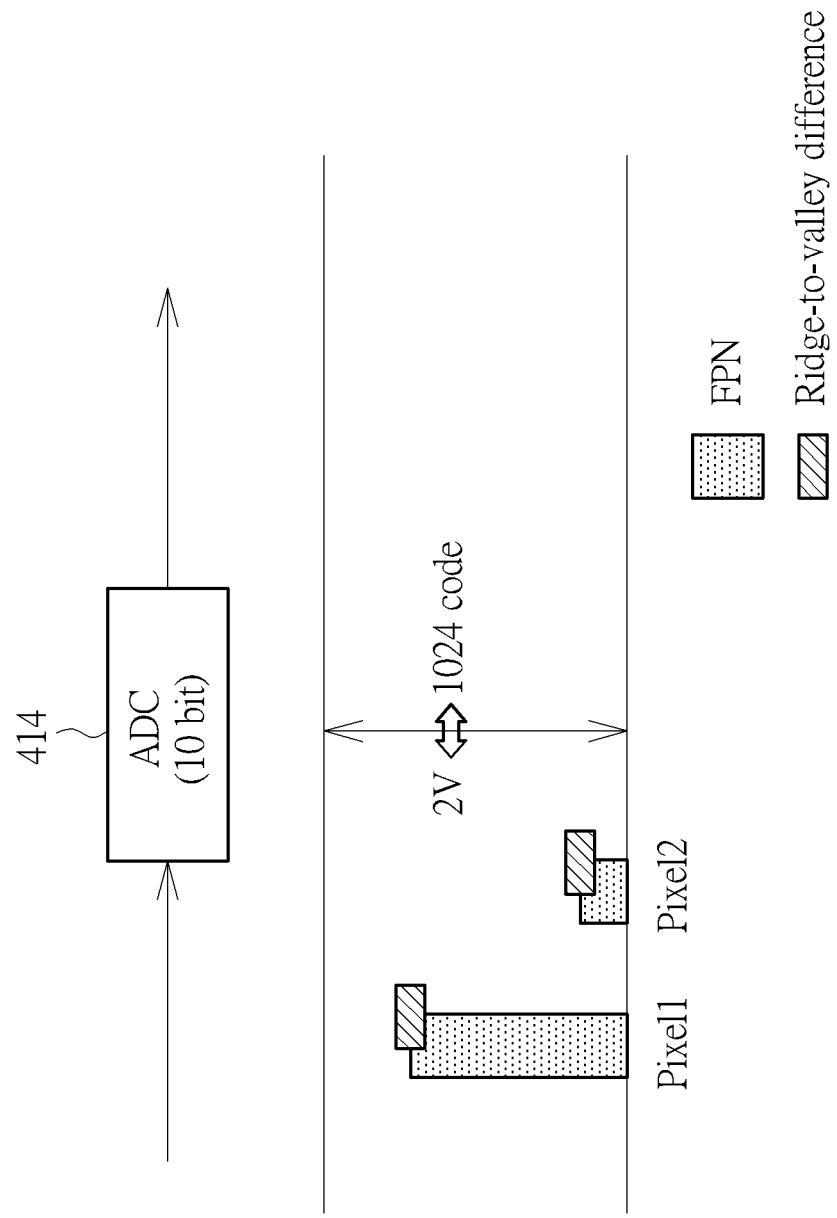
FIG. 5 is a schematic diagram of the fingerprint image signal generated from two sensing pixels at different locations.

Please refer to FIG. 5, which is a schematic diagram of the fingerprint image signal S_FPR generated from two sensing pixels at different locations, where pixel 1 may be at the middle area of the lens and have a higher FPN, and pixel 2 may be at the peripheral area of lens and have a lower FPN. The FPN in the fingerprint image signal S_FPR is an offset or noise that should be removed. The difference of fingerprint signals generated based on ridges and valleys of fingerprint is added on the level of the FPN; this ridge-to-valley difference is a desired signal.

Supposing that the ADC 414 is a 10-bit ADC and its maximum operating voltage is 2V, the ADC's output range includes 1024 codes. Taking this example to show possible order of signal values (for example, magnitudes) of the FPN and the actual fingerprint ridge-to-valley signal, the FPN may approximately occupy 700 codes in maximum, but the actual signal to be retrieved (i.e., the ridge-to-valley difference) only has approximately 40 codes. Therefore, the ratio of the effective code is quite low, resulting in a waste on ADC's resource.

Figure 6:
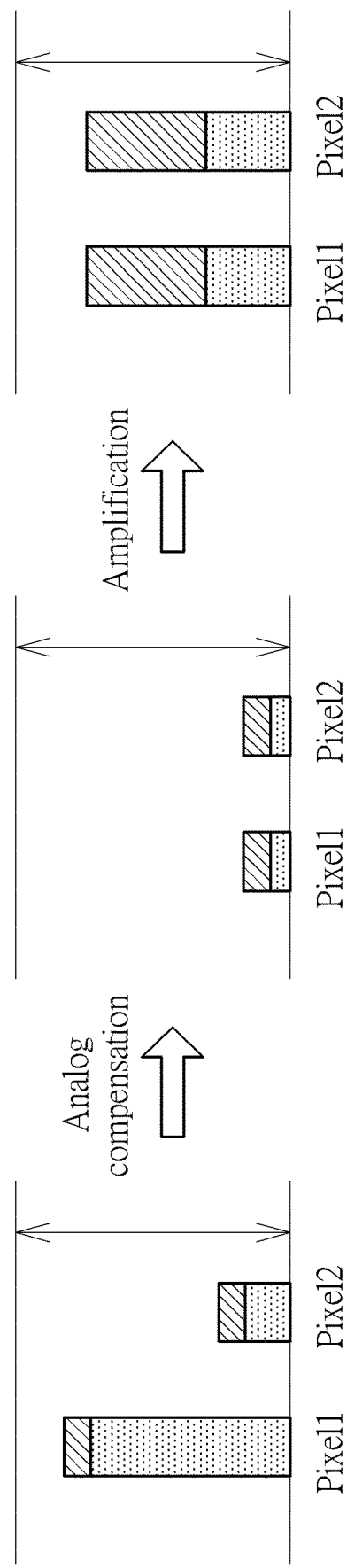
FIG. 6 is a schematic diagram of an implementation of the AFE circuit for reducing or removing the FPN before the fingerprint image signal enters the ADC.

Please refer to FIG. 6, which is a schematic diagram of an implementation of the AFE circuit 412 for reducing or removing the FPN before the fingerprint image signal S_FPR enters the ADC 414 according to an embodiment. Before the fingerprint image signal S_FPR enters the ADC 414, analog compensation is applied to the fingerprint image signal S_FPR in the AFE circuit 412, to reduce or remove the FPN corresponding to sensing pixels at different locations. The signal can be amplified by a gain circuit in the AFE circuit 412. As a result, after processing of the ADC 414, the generated data code may reflect the fingerprint signal more effectively, since the ratio of effective codes outputted by the ADC 414 may be significantly increased.

Figure 7:
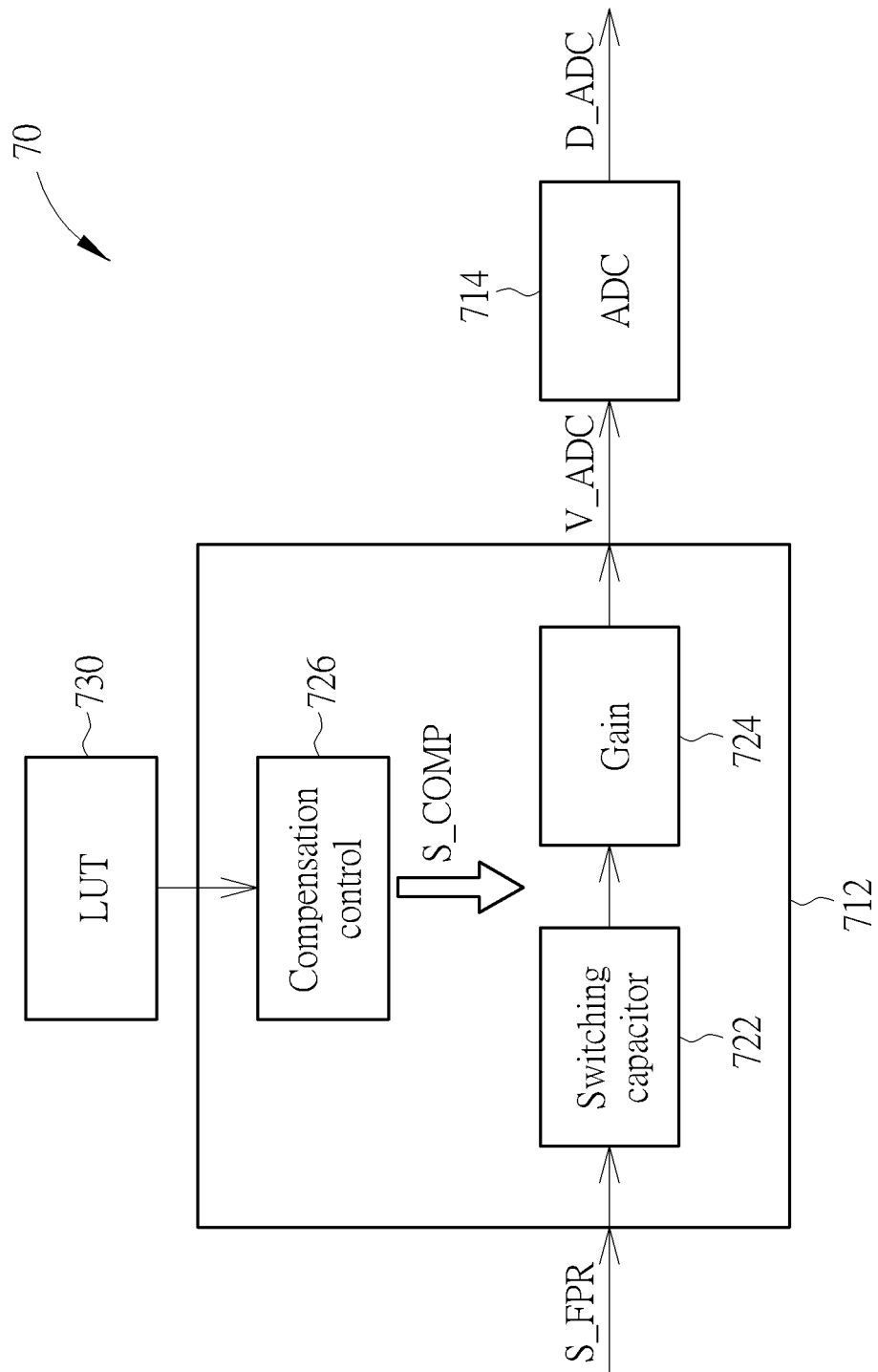
FIG. 7 is a schematic diagram of a fingerprint signal processing circuit according to an embodiment of the present invention.

Please refer to FIG. 7, which is a schematic diagram of a fingerprint signal processing circuit 70 according to an embodiment of the present invention. As shown in FIG. 7, the fingerprint signal processing circuit 70 includes an AFE circuit 712 and an ADC 714, where the circuit elements after the ADC 714 such as the DSP circuit are omitted for brevity and may be referred to FIG. 4 by analogy. A lookup table (LUT) 730, which may or may not be included in the AFE circuit 712, is illustrated in FIG. 7 to facilitate the illustration. The AFE circuit 712 is configured to receive the fingerprint image signal S_FPR from at least one sensing pixel of a fingerprint sensor. The AFE circuit 712 may include a switching capacitor circuit 722, a gain circuit 724 and a compensation control circuit 726. The switching capacitor circuit 722 can be configured to receive and sample the fingerprint image signal S_FPR. The gain circuit 724, coupled to the output terminal of the switching capacitor circuit 722, can be configured to amplify the fingerprint image signal S_FPR. Note that the gain circuit 724 may include one or more stages of operational amplifiers for realizing the amplification operation. The compensation control circuit 726, coupled to the switching capacitor circuit 722 or the gain circuit 724, may send a compensation signal S_COMP to the switching capacitor circuit 722 or the gain circuit 724. The compensation signal S_COMP may reduce or cancel the FPN from the fingerprint image signal S_FPR, such that an analog output signal V_ADC can be generated and sent to the ADC 714. Thereafter, the ADC 714 may convert the analog output signal V_ADC into a corresponding digital code D_ADC.

As mentioned above, the fingerprint image signals S_FPR received from sensing pixels at different positions may have different magnitudes of fixed pattern offset, causing different levels of FPNs. Preferably, the signal value (for example, magnitude) of the compensation signal S_COMP may correspond to the touched position of the finger in the fingerprint sensor. The touched position can be a position of the at least one sensing pixel. More specifically, the signal value of the compensation signal S_COMP may be determined according to the touched position of the finger or the position of the at least one sensing pixel with respect to the lens of the fingerprint sensor and/or the structure of the OLED panel, so that the compensation signal S_COMP may have a signal value reflecting or representing the corresponding FPN. For example, if the fingerprint image signal S_FPR is received from a first sensing pixel at the middle area of the lens, the compensation signal S_COMP having a first signal value may be applied to compensate this fingerprint image signal S_FPR. If the fingerprint image signal S_FPR is received from a second sensing pixel at the peripheral area of the lens, the compensation signal S_COMP having a second signal value may be applied to compensate this fingerprint image signal S_FPR. The second signal value may be smaller than the first signal value since the FPN included in the fingerprint image signal S_FPR received from the second sensing pixel is smaller than the FPN included in the fingerprint image signal S_FPR received from the first sensing pixel.

Please note that a fingerprint signal processing circuit is usually configured to receive fingerprint image signals from an array of sensing pixels in the fingerprint sensor. In an embodiment, in order to process the fingerprint image signals from the pixel array, the fingerprint signal processing circuit may include several channels, each having an AFE circuit and an ADC. The AFE circuit and the ADC in each channel are configured to process the fingerprint image signals received from different sensing pixels. In consideration of circuit costs and processing time, there may be any number of AFE circuits and ADCs disposed in the system. A multiplexer (MUX) circuit may be disposed between the pixel array and the AFE circuit, to switch the signal of each sensing pixel to be forwarded to and processed in a corresponding channel in a time division manner. Alternatively, a fingerprint signal processing circuit may include multiple AFE circuits coupled to one ADC, and the fingerprint image signals may be transmitted to the ADC(s) in a time division manner.

Please continue to refer to FIG. 7. The compensation information may be stored in the LUT 730 in digital form. When a fingerprint image signal S_FPR from a specific sensing pixel is received by the AFE circuit 712 or expected to be received by the AFE circuit 712, the compensation information associated with the specific sensing pixel may be outputted through the compensation control circuit 726, which may be capable of reducing or removing the FPN in the fingerprint image signal S_FPR. In an embodiment, the compensation control circuit 726 may receive data such as a fixed pattern data associated with the specific sensing pixel from the LUT 730, and then convert the fixed pattern data into a fixed pattern voltage or a fixed pattern current to be sent to the switching capacitor circuit 722 or the gain circuit 724. The fixed pattern voltage/current may be served as the compensation signal S_COMP as shown in FIG. 7. Therefore, the AFE circuit 712 is capable of compensating the FPN, and the FPN may be reduced or removed in the analog domain.

In an embodiment, the LUT 730 may be implemented in a volatile memory for storing the fixed pattern data, and the volatile memory may be disposed in the fingerprint signal processing circuit 70 or may be a memory module independent to the fingerprint signal processing circuit 70. For example, if the fingerprint signal processing circuit 70 is a fingerprint processing IC of a mobile phone, a static random access memory (SRAM) may be disposed in the fingerprint processing IC, for storing the fixed pattern data for compensation (e.g., stored as the LUT 730). In general, common memory devices such as a one-time programmable (OTP) memory, flash memory and buffer may occupy quite large area in the IC, and thus may not be feasible in the fingerprint processing IC having a demand of small circuit area. Therefore, the present invention may utilize an SRAM having a small size in the fingerprint processing IC. However, the SRAM is a volatile memory, in which the stored data may vanish after power-off. Therefore, the compensation information may be stored in a master memory of the mobile phone in advance, and written into the SRAM when the fingerprint processing IC is powered on. Therefore, during the compensation process, the corresponding compensation signal S_COMP may be outputted based on the information stored in the SRAM (e.g., as the LUT 730). The usage of volatile memory such as SRAM allows the fingerprint signal processing circuit 70 to obtain the compensation information without deployment of large memory module, facilitating the purposes of area reduction and cost saving.

In a practical application, a file including the total compensation information corresponding to a fingerprint sensor may have approximately 73 k bytes, and the operable system storage space of a mobile phone may be approximately in the order of 30M bytes; hence, the compensation information may not be a significant burden on the memory of the mobile phone system. In such a condition, compared to disposing a large-area non-volatile memory in the fingerprint processing IC, the method of storing the compensation information in the system memory space of the mobile phone and then writing it into the SRAM when the IC is powered on is more feasible.

In an embodiment, the compensation control circuit 726 may include a digital-to-analog converter (DAC), for converting the digital fixed pattern data into a voltage or current signal. More specifically, the compensation control circuit 726 may include a voltage DAC configured to convert digital data into voltage values, or include a current DAC configured to convert digital data into current values.

In the compensation scheme of the present invention, the compensation information corresponding to different positions may be acquired from the LUT 730, respectively, according to which sensing point or sensing pixel the received fingerprint image signal is generated from. As mentioned above, at least one sensing pixel located at the middle area of lens may have a larger FPN, and thus the compensation control circuit 726 should output a larger compensation signal S_COMP to cancel the FPN. In contrary, at least one sensing pixel located at the peripheral area of lens may have a smaller FPN, and thus the compensation control circuit 726 should output a smaller compensation signal S_COMP to cancel the FPN. The compensation signal S_COMP for each sensing pixel may be obtained according to the touched position of the finger or the position of the at least one sensing pixel relative to the lens and the panel structure. The position information is known information and has a fixed pattern; hence, the corresponding compensation information may be stored in the memory in advance.

In some embodiments, the AFE circuit comprises a compensation capacitor configured to have a variable capacitance configured to be adjusted according to the compensation signal. In the same or alternative embodiments, a current passing through the AFE circuit is controlled by at least one voltage signal having a variable voltage level configured to be adjusted according to the compensation signal.

Figure 8:
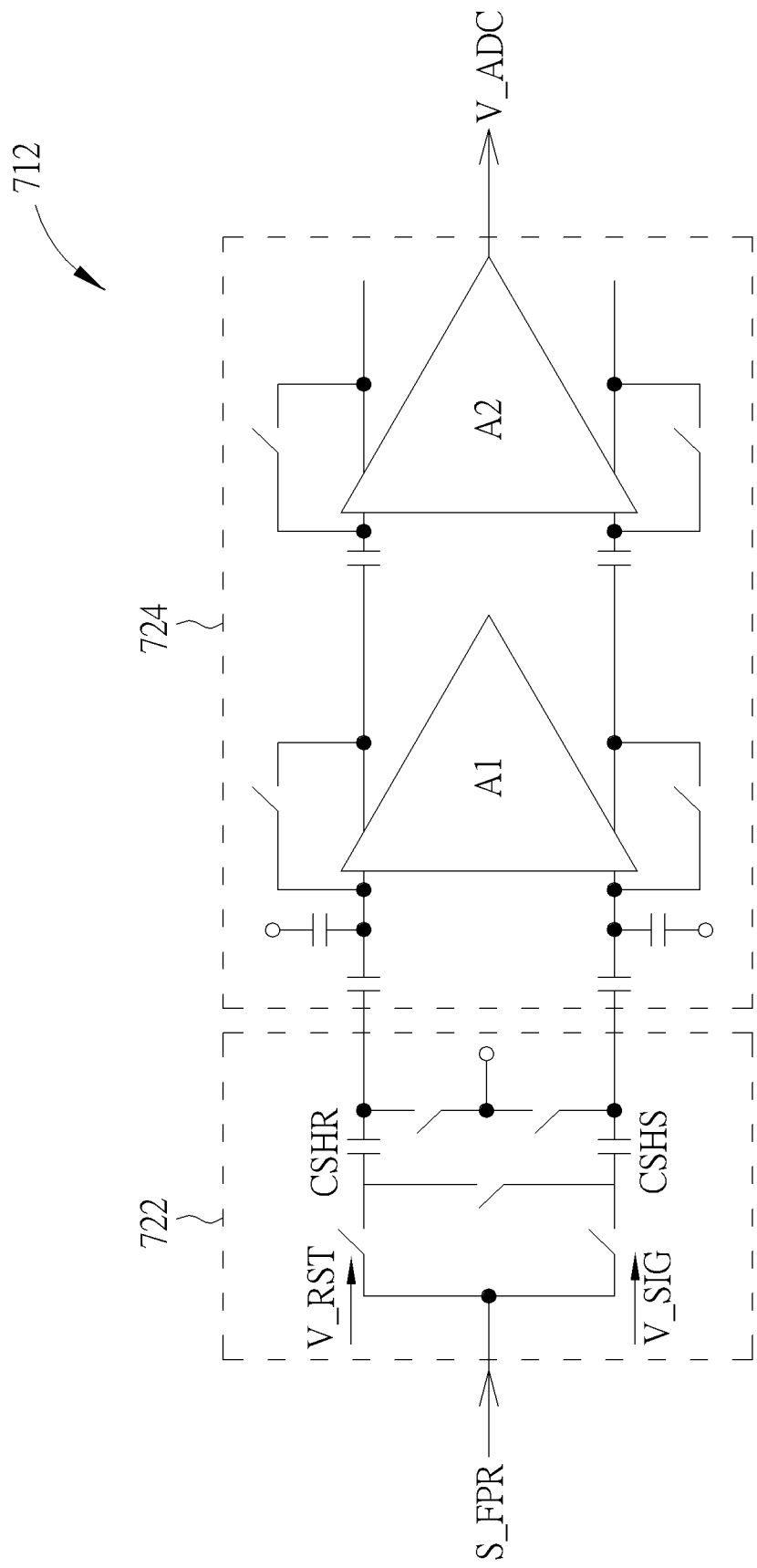
FIG. 8 is a schematic diagram of a basic structure of the AFE circuit.

Please note that the compensation control circuit 726 may send the compensation signal S_COMP to any possible node in the switching capacitor circuit 722 or the gain circuit 724. For example, the compensation signal S_COMP may be coupled to the input terminal of the switching capacitor circuit 722, the output terminal of the gain circuit 724, or a connection line between the switching capacitor circuit 722 and the gain circuit 724. Please refer to FIG. 8, which is a schematic diagram of a basic structure of the AFE circuit 712, where the detailed circuit structure of the switching capacitor circuit 722 and the gain circuit 724 are illustrated. As shown in FIG. 8, the switching capacitor circuit 722, which is configured to receive and sample the fingerprint image signal S_FPR outputted from at least one sensing pixel, may include capacitors CSHR and CSHS and several switches to be implemented as a correlated double sampling (CDS) circuit. These switches may be alternatively turned on or off in different phases to sample the fingerprint image signal S_FPR. The gain circuit 724, which is coupled to the output terminals of the switching capacitor circuit 722 and configured to amplify the received signal to generate the analog output signal V_ADC, includes two stages of operational amplifiers A1 and A2. With the two stages of operational amplifiers A1 and A2, the gain circuit 724 may perform amplification on the received fingerprint image signal S_FPR by two times.

In this embodiment, the sampling operation includes two steps. In Step 1, the switching capacitor circuit 722 may receive a reset voltage V_RST, which may be coupled to and stored in the capacitor CSHR. In Step 2, the switching capacitor circuit 722 may receive a voltage signal V_SIG including information of the fingerprint image signal S_FPR, where the voltage signal V_SIG may be coupled to and stored in the capacitor CSHS. The voltage signal V_SIG and the reset voltage V_RST may have a voltage difference $\Delta V$, which corresponds to the ridge and valley information of the fingerprint image signal S_FPR. The relations of these parameters may satisfy an equation as described below:

$$V\_SIG=V\_RST+\Delta V.$$

The voltage difference $\Delta V$ of the reset voltage V_RST and the voltage signal V_SIG obtained in the two steps is outputted to the gain circuit 724 from the switching capacitor circuit 722, and then amplified by the gain circuit 724. Therefore, the related transfer function may be generally expressed as:

$$V\_ADC=AG\times(V\_SIG-V\_RST)=AG\times\Delta V,$$

where AG refers to the total gain value of the gain circuit 724 (i.e., combination of the gains of the operational amplifiers A1 and A2).

If the compensation control circuit 726 is included, the compensation mechanism is applied to cancel the FPN generated from the fingerprint sensor, to deduct a voltage signal V_COMP corresponding to the FPN in the analog output signal V_ADC to be outputted to the ADC 714, so that the transfer function of the AFE circuit 712 may become:

$$V\_ADC=AG\times(V\_SIG-V\_RST)-V\_COMP,$$

where the voltage signal V_COMP has a voltage value corresponding to the compensation signal S_COMP. Note that in another embodiment, the compensation signal S_COMP may also be a current signal or may be converted into an equivalent current signal. In this embodiment, the compensation control circuit 726 may generate different voltage signals V_COMP for the fingerprint image signal S_FPR from different sensing pixels based on the pixels' positions.

Figure 9:
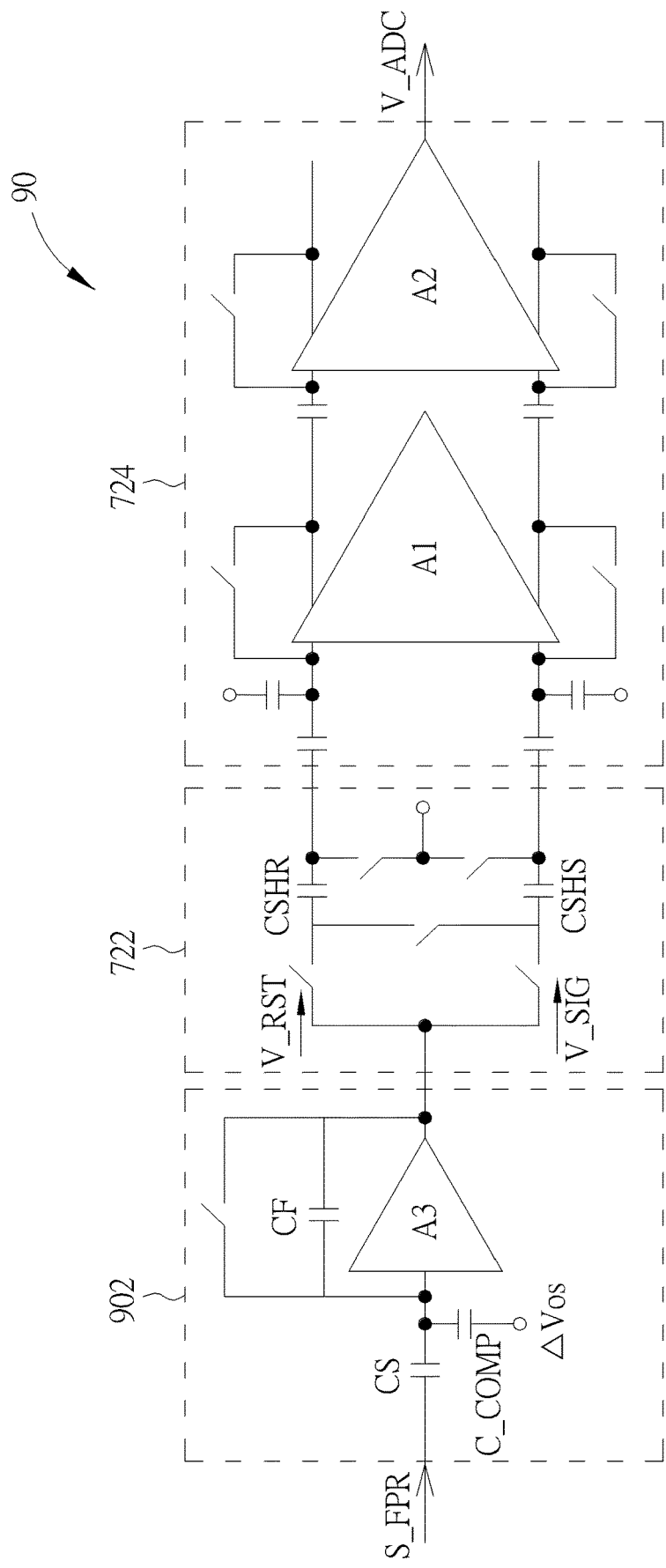
FIG. 9 is a schematic diagram of an AFE circuit according to an embodiment of the present invention.

In an embodiment, the compensation signal S_COMP is coupled to the input terminal of the switching capacitor circuit 722. Please refer to FIG. 9, which is a schematic diagram of an AFE circuit 90 according to an embodiment of the present invention. As shown in FIG. 9, the structure of the AFE circuit 90 is similar to the structure of the AFE circuit 712 shown in FIG. 8, so signals and elements having similar functions are denoted by the same symbols. The difference between the AFE circuit 90 and the AFE circuit 712 is that, the AFE circuit 90 further includes another gain circuit 902 and a capacitor unit C_COMP. The output terminal of the gain circuit 902 is coupled to the input terminal of the switching capacitor circuit 722, and the input terminal of the gain circuit 902 is coupled to the capacitor unit C_COMP. In this embodiment, the compensation signal S_COMP is coupled from a terminal of the capacitor unit C_COMP to the input terminal of the gain circuit 902, to be sent to the AFE circuit 90, which may compensate the FPN.

More specifically, in the gain circuit 902, the capacitors CS and CF and the operational amplifier A3 may construct a voltage amplifier (gain=−CF/CS), and the capacitor unit C_COMP together with a voltage signal $\Delta Vos$ may generate a current that passes through the voltage amplifier to be outputted to the switching capacitor circuit 722 and the gain circuit 724 at the back end, to realize the signal compensation.

In detail, according to the circuit structure of the AFE circuit 90 shown in FIG. 9, the operations of the gain circuit 902, the switching capacitor circuit 722 and the gain circuit 724 in the AFE circuit 90 may substantially include the following steps (not including the operations of the voltage signal $\Delta Vos$ and the corresponding capacitor unit C_COMP). Step 1 is a reset phase, where the gain circuit 902 may receive a reset voltage V_RST and thereby output the reset voltage V_RST to the switching capacitor circuit 722, where the reset voltage V_RST may be coupled to and stored in the capacitor CSHR. Step 2 is a signal phase, where the gain circuit 902 may receive the fingerprint image signal S_FPR and thereby output the voltage signal V_SIG, which equals:

$$V\_SIG = V\_RST + \frac{CS}{CF} \times \Delta V,$$

where ΔV is the voltage signal carrying ridge and valley information of the fingerprint image. The voltage signal V_SIG may be coupled to and stored in the capacitor CSHS. In Step 3, the output signal of the switching capacitor circuit 722 may be amplified by the gain circuit 724 to generate the analog output signal V_ADC to be outputted to the ADC 714, where the analog output signal V_ADC equals:

$$V\_ADC = AG \times (V\_SIG - V\_RST) = AG \times \frac{CS}{CF} \times \Delta V.$$

If compensation of the voltage signal ΔVos and the capacitor unit C_COMP is included, the abovementioned Steps 2 and 3 may be modified as follows. In Step 2, the voltage signal V_SIG outputted from the gain circuit 902 to the switching capacitor circuit 722 becomes:

$$V\_SIG = \left(V\_RST + \frac{CS}{CF} \times \Delta V - \frac{C\_COMP}{CF} \times \Delta Vos\right),$$

where the voltage signal V_SIG may be coupled to and stored in the capacitor CSHS. In Step 3, the analog output signal V_ADC to be outputted to the ADC 714 becomes:

$$V\_ADC =$$
$$AG \times (V\_SIG - V\_RST) = AG \times \left(\frac{CS}{CF} \times \Delta V - \frac{C\_COMP}{CF} \times \Delta Vos\right).$$

In the above embodiment, the voltage signal ΔVos and the capacitor unit C_COMP may also be combined to realize an equivalent current source (of which the current value is ΔIos, which equals C_COMP×ΔVos). The abovementioned formulas may also be represented by current values without changing their operations.

In an embodiment, different degrees of signal compensation may be achieved by adjusting the capacitance value or switching the voltage/current values of the compensation signal S_COMP. For example, the capacitor unit C_COMP for coupling the voltage signal ΔVos may be a variable capacitor, of which the capacitance may be adjusted by the compensation control circuit 726 according to which position of sensing pixel the fingerprint image signal S_FPR comes from, in order to change the current signal value outputted to the gain circuit 902. Alternatively, there may be multiple capacitors having different values disposed between the input source of the voltage signal ΔVos and the gain circuit 902, and the compensation control circuit 726 may switch the connections of the capacitors according to which position of sensing pixel the fingerprint image signal S_FPR comes from, in order to change the signal value of the output compensation current. In another embodiment, one of multiple voltage signals ΔVos having different voltage levels may be selectively outputted, to achieve a target compensation value. The adjustment of compensation values may be controlled according to the compensation data stored in the SRAM, which may reduce or eliminate the influences generated from different light transmission ratios due to the implementation of lens and the structure of panel.

Please note that the method of outputting the compensation signal S_COMP is not limited to the above descriptions, and the position of outputting the voltage signal ΔVos and related compensation current is not limited to the implementation as shown in FIG. 9. For example, in an embodiment, the compensation signal S_COMP may be coupled to the input terminals of one of the operational amplifiers A1 and A2. More specifically, a capacitor unit may be coupled to each input terminal of the operational amplifier A1 or A2, and the compensation signal S_COMP may be coupled from a terminal of the capacitor unit to each input terminal of the operational amplifier A1 or A2.

Figure 10:
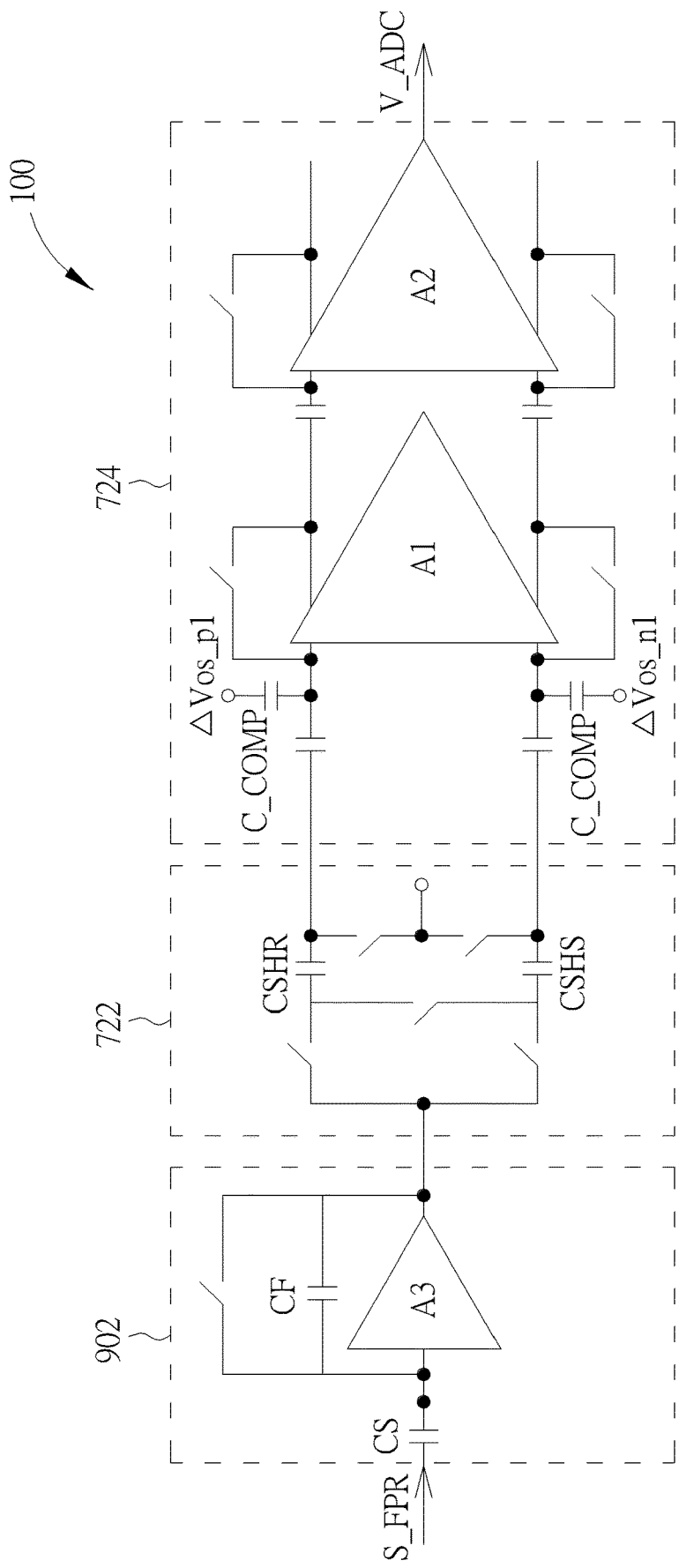
FIG. 10 is a schematic diagram of another AFE circuit according to an embodiment of the present invention.

Please refer to FIG. 10, which is a schematic diagram of another AFE circuit 100 according to an embodiment of the present invention. As shown in FIG. 10, the structure of the AFE circuit 100 is similar to the structure of the AFE circuit 90 shown in FIG. 9, so signals and elements having similar functions are denoted by the same symbols. The difference between the AFE circuit 100 and the AFE circuit 90 is that, in the AFE circuit 100, the capacitor unit C_COMP is integrated into the original capacitors disposed at the input terminals of the operational amplifier A1. The voltage signals ΔVos_p1 and ΔVos_n1 may be respectively combined with the original signals forwarded to the input terminals of the operational amplifier A1 through the capacitors; hence, the voltage signals ΔVos_p1 and ΔVos_n1 may be converted into compensation currents to be received by the gain circuit 724. The related operations are identical to the embodiments of FIG. 9, and will not be narrated herein. In this embodiment, since the capacitors in the original AFE circuit are applied to receive the compensation signal, the circuit area and cost may further be reduced. In another embodiment, the compensation signal may also be applied to the input terminals of the operational amplifier A2 in a similar manner.

In another embodiment, the compensation signal S_COMP may be coupled to the output terminals of the gain circuit 724. More specifically, a capacitor unit may be coupled to each output terminal of the operational amplifier in the gain circuit 724, and the compensation signal S_COMP may be coupled from a terminal of the capacitor unit to one of the output terminals of the operational amplifier.

Figure 11:
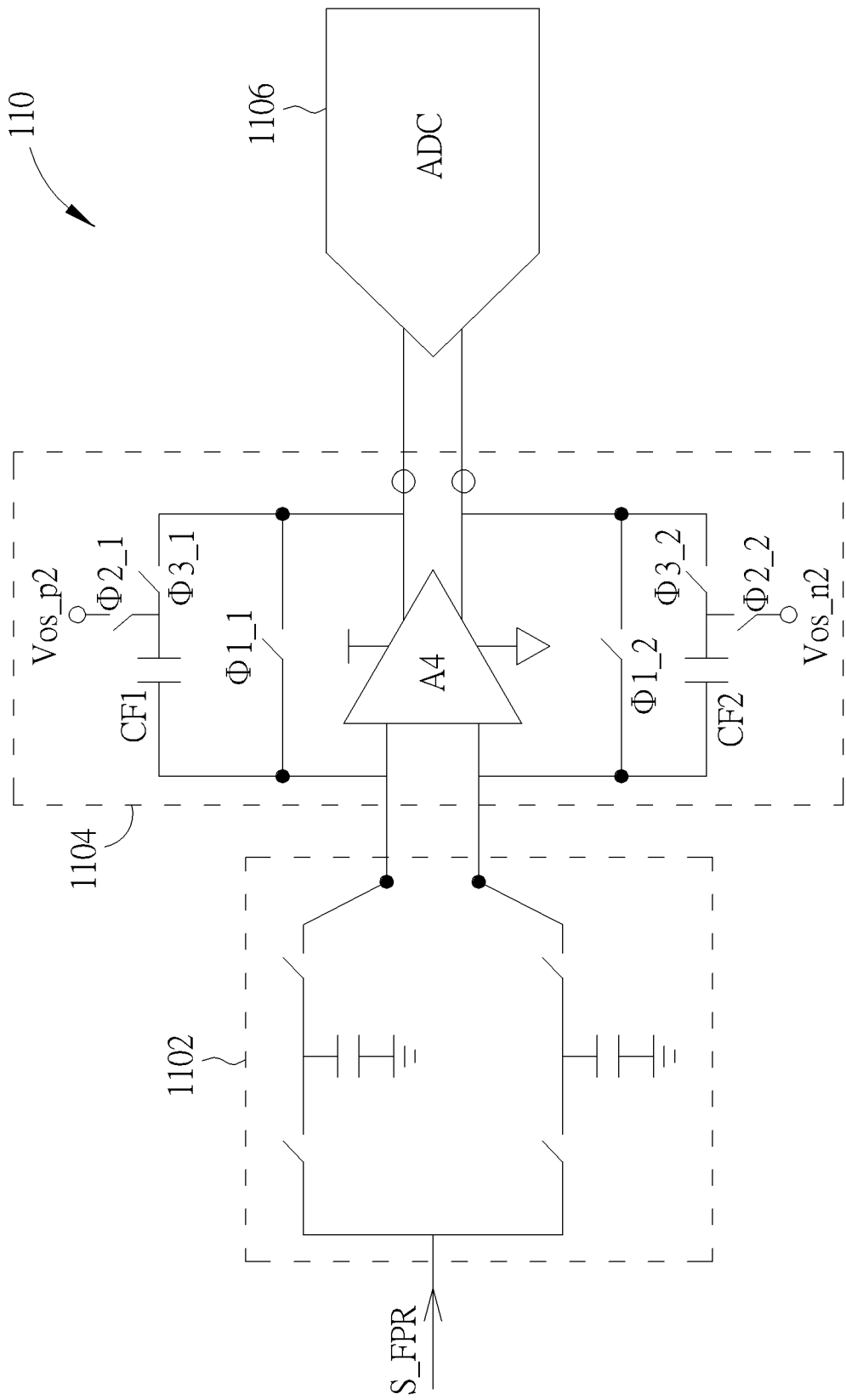
FIG. 11 is a schematic diagram of a further AFE circuit according to an embodiment of the present invention.

Please refer to FIG. 11, which is a schematic diagram of a further AFE circuit 110 according to an embodiment of the present invention. As shown in FIG. 11, the AFE circuit 110 includes a switching capacitor circuit 1102 and a gain circuit 1104. An ADC 1106, which is not included in the AFE circuit 110, is illustrated in FIG. 11 to facilitate the illustration. Note that the circuit structures of the switching capacitor circuit 1102 and the gain circuit 1104 are different from the circuit structures of the switching capacitor circuit 722 and the gain circuit 724 shown in FIG. 8, and those skilled in the art should understand that the implementations of the switching capacitor circuit and the gain circuit are not limited to those described in this disclosure. In this embodiment, the gain circuit 1104 includes an operational amplifier A4 with feedback capacitors CF1 and CF2 each coupled between an input terminal and an output terminal of the operational amplifier A4. Switches Φ1_1, Φ1_2, Φ2_1, Φ2_2, Φ3_1 and Φ3_2 are disposed to realize the gain circuit 1104. In detail, the feedback capacitors CF1 and CF2 may be configured to store information associated with the operational amplifier A4, such as the input offset information of the operational amplifier A4. For example, in order to realize the compensation for FPN, voltage signals ΔVos_p2 and ΔVos_n2 may be coupled to the capacitors CF1 and CF2 through the switches Φ2_1 and Φ2_2, respectively. Specifically, a terminal of the switches Φ2_1 and Φ2_2 is coupled to the capacitors CF1 and CF2, respectively, and the voltage signals ΔVos_p2 and ΔVos_n2 are respectively sent to another terminal of the switches Φ2_1 and Φ2_2.

Please note that the embodiments of the present invention aim at providing an AFE circuit capable of reducing or removing the FPN in the received fingerprint image signal. Those skilled in the art may make modifications and alternations accordingly. For example, the structure illustrated in FIG. 7 is one of various implementations of the present invention. In another embodiment, the LUT 730 may be integrated into the compensation control circuit 726. In addition, the compensation control circuit 726 may be realized by other method, in order to output the compensation signal S_COMP in voltage or digital form. That is, in the above embodiments, the compensation signal S_COMP is coupled to the switching capacitor circuit 722 or the gain circuit 724 through a capacitor unit with a voltage signal, but the compensation signal S_COMP may be coupled by other method. Further, in the above embodiments, the fingerprint signal processing circuit is applied to a fingerprint sensor configured to sensing light from an OLED panel. In another embodiment, the fingerprint signal processing circuit of the present invention may be applicable to a liquid crystal display (LCD) panel, a plasma display panel (PDP), or any other type of display panel. Alternatively or additionally, the fingerprint sensor may be implemented with any type of sensing element such as a complementary metal-oxide semiconductor (CMOS) image sensor (CIS), a photo resistor, which should not be a limitation of the scope of the present invention. Moreover, in the above embodiments, the compensation information may correspond to the position of each sensing pixel to be stored in the LUT. In order to save the size of SRAM usage, multiple sensing pixels may be combined as a group to apply the same compensation information.

In an embodiment, the fingerprint image signals sensed by a group of adjacent sensing pixels may be configured to be compensated with the compensation signal having the same signal value. As mentioned above, in the lens-type fingerprint sensor, the middle area may have higher brightness and the peripheral area may have lower brightness. Nevertheless, as for two adjacent sensing pixels, the difference of their brightness may not be evident; hence, satisfactory compensation effects may still be achieved even if the compensation signal having the same signal value is applied to the fingerprint image signals from adjacent sensing pixels. Therefore, one compensation information may be applied to these two adjacent sensing pixels. In an embodiment, every adjacent 2×2 sensing pixels may be combined as a group which applies the same compensation information. Since only one compensation information is recorded for 4 sensing pixels, the used memory space may be decreased to ¼ of the original level. In detail, during the process of determining the signal value of the compensation signal, the FPN signal values respectively obtained from the 4 adjacent sensing pixels may be averaged, and the average value is taken as the compensation value for these 4 sensing pixels and stored in the LUT.

Please note that the method of dividing the at least one sensing pixel into groups should not be limited thereto. For example, the group division may be realized based on 3×3 or 4×4 adjacent sensing pixels. In another embodiment, the signal values of the compensation signals used to compensate the sensing pixels in the fingerprint sensor may be distributed symmetrically with respect to a middle point of the lens of the fingerprint sensor. According to the symmetric feature of the lens, all of the sensing pixels may be equally divided into different groups, for example, four quadrants by using a horizontal line and a vertical line. As long as the compensation information of the at least one sensing pixel in one quadrant is obtained, the information may be applied to the corresponding sensing pixels in other quadrants based on the symmetry.

Figure 12:
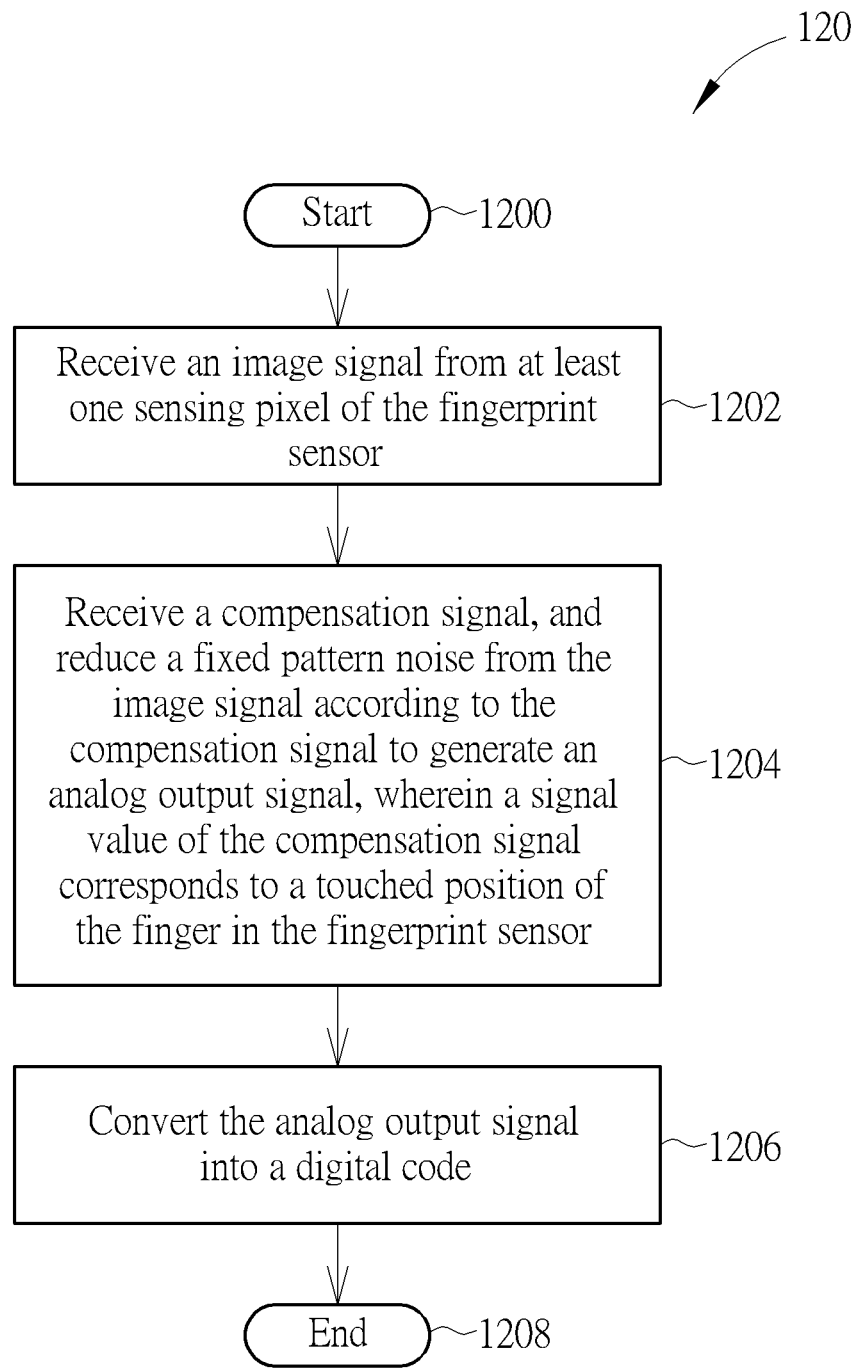
FIG. 12 is a schematic diagram of a signal processing process according to an embodiment of the present invention.

The abovementioned operations of reducing or removing the FPN may be summarized into a signal processing process 120, as shown in FIG. 12. The signal processing process 120 may be implemented in a fingerprint signal processing circuit coupled to a fingerprint sensor configured to sense light from a display panel, specifically implemented in an AFE circuit coupled to the input terminal of the ADC included in the fingerprint signal processing circuit. The signal processing process 120 may include the following steps:

Step 1200: Start.

Step 1202: Receive an image signal from at least one sensing pixel of the fingerprint sensor.

Step 1204: Receive a compensation signal, and reduce a fixed pattern noise from the image signal according to the compensation signal to generate an analog output signal, wherein a signal value of the compensation signal corresponds to a touched position of the finger in the fingerprint sensor.

Step 1206: Convert the analog output signal into a digital code.

Step 1208: End.

The detailed operations and alternations of the signal processing process 120 are illustrated in the above paragraphs, and will not be narrated herein.

To sum up, the embodiments of the present invention may provide a method and circuit structure used for a fingerprint sensor of a fingerprint recognition system. The embodiments of the present invention may compensate the image signal in the AFE circuit at the front end of the ADC. After the compensation signal is deducted from the fingerprint image signal of the at least one sensing pixel, the fingerprint image signal may be amplified in the gain circuit. The signal after amplification may be outputted to the ADC. This may achieve the purpose of increasing the ADC's efficiency. The embodiments can reduce or remove the FPN and/or increase the performance of ADC.

In some implementations, due to the optical features of the lens-type image sensor, the middle area of lens may have higher brightness and the peripheral area of lens may have lower brightness, such that the signals outputted from sensing pixels in different positions may have different FPN values. The FPN may also be influenced by the panel structure. The difference between these FPNs may cause the ADC to generate a significant number of ineffective codes. Therefore, the embodiments of the present invention may compensate the image signal in the AFE circuit at the front end of the ADC, which can reduce or remove the FPN and increase the performance of ADC.

In addition, the fingerprint signal processing circuit (as a fingerprint processing IC) may use the volatile memory (e.g., the SRAM) having a smaller size for storing related compensation information. For different sensing pixels, the FPN may be measured in advance and the related compensation information is stored in the system memory. When the fingerprint processing IC is powered on, the compensation information may be loaded into the SRAM in the fingerprint processing IC.

During the fingerprint sensing process, the compensation control circuit may output the corresponding compensation signal to the AFE circuit according to the touched position of the finger. In an embodiment, a capacitor may be applied to convert the compensation voltage signal into a current signal to be coupled to the input terminal of the switching capacitor circuit, the input terminal of the gain circuit, the output terminal of the gain circuit, or any other node in the AFE circuit. The capacitance value may be adjusted or the values of the compensation signals may be different for different touch positions or different sensing pixels, which may be adapted to the difference between the FPNs corresponding to different positions.

After the compensation signal is deducted from the fingerprint image signal of the at least one sensing pixel, the fingerprint image signal may be amplified in the gain circuit. The signal after amplification may be outputted to the ADC. This may achieve the purpose of increasing the ADC's efficiency. In a practical circuit, the FPN compensation may be performed in the AFE circuit, and after the ADC performs conversion to generate the digital code, another compensation may be performed in digital domain, which may entirely eliminate the FPN.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fingerprint signal processing circuit for a fingerprint sensor configured to sense light from a display panel touchable by a finger, comprising:
   an analog front-end (AFE) circuit, configured to receive an image signal from the fingerprint sensor and generate an analog output signal, the AFE circuit comprising:
      a compensation control circuit, configured to generate a compensation signal;
      a gain circuit, configured to receive the compensation signal from the compensation control circuit and process the image signal according to the compensation signal to generate the analog output signal, wherein the compensation signal is adapted to modify the image signal and a signal value of the compensation signal corresponds to a touched position of the finger in the fingerprint sensor; and
   an analog-to-digital converter, coupled to the AFE circuit, configured to convert the analog output signal into a digital code;
   wherein the signal value of the compensation signal is determined according to the touched position of the finger with respect to at least one of a lens of the fingerprint sensor and the display panel.

2. The fingerprint signal processing circuit of claim 1, wherein the gain circuit is configured to reduce a fixed pattern noise from the image signal according to the compensation signal.

3. The fingerprint signal processing circuit of claim 2, wherein the fixed pattern noise comprises noise caused by the lens of the fingerprint sensor having different light transmission ratios at different locations of the lens.

4. The fingerprint signal processing circuit of claim 2, wherein the fixed pattern noise comprises noise caused by a pattern of the display panel having different light transmission ratios at different locations of the display panel.

5. The fingerprint signal processing circuit of claim 1, wherein the compensation control circuit is configured to perform the following steps:
   receiving data from a lookup table; and
   converting the data into a voltage or a current to be served as the compensation signal.

6. The fingerprint signal processing circuit of claim 5, wherein the data in the lookup table is stored in a volatile memory.

7. The fingerprint signal processing circuit of claim 1, wherein a first sensing pixel at a middle area of the lens is compensated using the compensation signal having a first signal value, and a second sensing pixel at a peripheral area of the lens is compensated using the compensation signal having a second signal value smaller than the first signal value.

8. The fingerprint signal processing circuit of claim 1, wherein the AFE circuit comprises a compensation capacitor configured to have a variable capacitance configured to be adjusted according to the compensation signal.

9. The fingerprint signal processing circuit of claim 1, wherein a current passing through the AFE circuit is controlled by at least one voltage signal having a variable voltage level configured to be adjusted according to the compensation signal.

10. The fingerprint signal processing circuit of claim 1, wherein the gain circuit of the AFE circuit further comprises:
    a switching capacitor circuit having an input terminal and at least one output terminal; and
    one or more first gain circuits coupled to the at least one output terminal of the switching capacitor circuit.

11. The fingerprint signal processing circuit of claim 10, wherein the compensation signal is coupled to the input terminal of the switching capacitor circuit.

12. The fingerprint signal processing circuit of claim 11, wherein the gain circuit further comprises a capacitor unit and a second gain circuit having an input terminal coupled to the capacitor unit and an output terminal coupled to the input terminal of the switching capacitor circuit, wherein the compensation signal is coupled from one terminal of the capacitor unit to the input terminal of the second gain circuit.

13. The fingerprint signal processing circuit of claim 10, wherein the compensation signal is coupled to an input terminal of one of the one or more first gain circuits.

14. The fingerprint signal processing circuit of claim 13, wherein the gain circuit further comprises a second gain circuit having an input terminal and an output terminal coupled to the input terminal of the switching capacitor circuit, and the one of the one or more first gain circuits comprises a capacitor unit and an operational amplifier circuit having an input terminal coupled to the capacitor unit, wherein the compensation signal is coupled from one terminal of the capacitor unit to the input terminal of the one of the one or more first gain circuits.

15. The fingerprint signal processing circuit of claim 10, wherein the compensation signal is coupled to an output terminal of one of the one or more first gain circuits.

16. The fingerprint signal processing circuit of claim 15, wherein the one of the one or more first gain circuits comprises a capacitor unit and an operational amplifier circuit having an input terminal and an output terminal coupled to the capacitor unit, wherein the compensation signal is coupled from one terminal of the capacitor unit to the output terminal of the one of the one or more first gain circuits.

17. The fingerprint signal processing circuit of claim 1, wherein image signals sensed by a group of adjacent sensing pixels in the fingerprint sensor are configured to be compensated with the compensation signal having a same signal value.

18. The fingerprint signal processing circuit of claim 1, wherein signal values of the compensation signal used to compensate a plurality of sensing pixels in the fingerprint sensor are distributed symmetrically with respect to a middle point of the lens of the fingerprint sensor.

19. The fingerprint signal processing circuit of claim 1, wherein the display panel is an organic light-emitting diode (OLED) display panel.

20. A method of processing fingerprint signals for a fingerprint signal processing circuit, which is coupled to a fingerprint sensor configured to sense light from a display panel touchable by a finger, the method comprising:
generating, by a compensation control circuit of the fingerprint signal processing circuit, a compensation signal;
receiving an image signal from the fingerprint sensor;
receiving the compensation signal from the compensation control circuit and processing the image signal according to the compensation signal to generate an analog output signal, wherein the compensation signal is adapted to modify the image signal and a signal value of the compensation signal corresponds to a touched position of the finger in the fingerprint sensor; and
converting the analog output signal into a digital code;
wherein the signal value of the compensation signal is determined according to the touched position of the finger with respect to at least one of a lens of the fingerprint sensor and the display panel.

21. The method of claim 20, wherein the processing of the image signal comprises reducing a fixed pattern noise from the image signal.

22. The method of claim 21, wherein the fixed pattern noise comprises noise caused by the lens of the fingerprint sensor having different light transmission ratios at different locations of the lens.

23. The method of claim 21, wherein the fixed pattern noise comprises noise caused by a pattern of the display panel having different light transmission ratios at different locations of the display panel.

24. The method of claim 20, further comprising:
receiving data from a lookup table; and
converting the data into a voltage or a current to be served as the compensation signal.

25. The method of claim 24, wherein the data in the lookup table is stored in a volatile memory.

26. The method of claim 20, wherein a first sensing pixel at a middle area of the lens is compensated using the compensation signal having a first signal value, and a second sensing pixel at a peripheral area of the lens is compensated using the compensation signal having a second signal value smaller than the first signal value.

27. The method of claim 20, wherein the fingerprint signal processing circuit comprises a compensation capacitor configured to have a variable capacitance, and the method further comprises adjusting the variable capacitance according to the compensation signal.

28. The method of claim 20, wherein a current passing through the fingerprint signal processing circuit is controlled by at least one voltage signal having a variable voltage level, and the method further comprises adjusting the variable voltage level according to the compensation signal.

29. The method of claim 20, further comprising:
compensating image signals sensed by a group of adjacent sensing pixels in the fingerprint sensor with the compensation signal having a same signal value.

30. The method of claim 20, wherein signal values of the compensation signal used to compensate a plurality of sensing pixels in the fingerprint sensor are distributed symmetrically with respect to a middle point of the lens of the fingerprint sensor.

31. The method of claim 20, wherein the display panel is an organic light-emitting diode (OLED) display panel.

* * * * *